July 10, 1962 J. P. SICARD 3,044,004
FREQUENCY DOUBLING CIRCUIT
Filed April 22, 1959
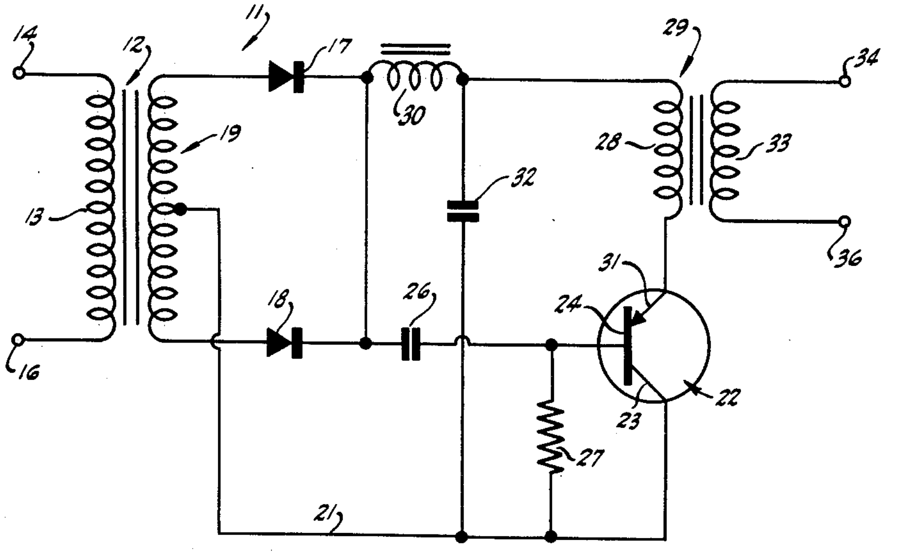
INVENTOR.
J. PIERRE SICARD
BY
Alvin E. Henderson
ATTORNEY

United States Patent Office 3,044,004
Patented July 10, 1962

3,044,004

FREQUENCY DOUBLING CIRCUIT

Jean Pierre Sicard, Palo Alto, Calif., assignor to Lenkurt Electric Co., Inc., San Carlos, Calif., a corporation of Delaware Filed Apr. 22, 1959, Ser. No. 808,142
6 Claims. (Cl. 321—4)

The present invention relates to an improved circuit for producing an output signal having twice the frequency of an input signal and, more particularly, to a circuit of the foregoing type requiring no internal power supply.

Although frequency doubling circuits are well known in the art, such circuits normally require power supplies to provide such as plate voltage and filament current. Certain applications of this type of circuit do not admit of additional power supplies and it is particularly with respect to these applications that the present invention is directed. While there are also known in the art so-called passive doublers wherein no additional power sources are provided beyond the energy supplied the circuit from the input signal, great difficulty is encountered with this type of circuit in that the conversion efficiency is extremely low. Even conventional frequency doublers normally operate in a conversion frequency range of the order of fifty percent while those employing only passive circuitry normally attain only a conversion efficiency of about ten to twelve percent. This low conversion efficiency makes passive circuit frequency doublers unsuited for many applications. A further advantage of the invention lies in the elimination of tuned output circuits which are commonly employed in frequency doubling circuits.

The present invention provides a frequency doubler employing only passive circuitry and producing a conversion efficiency in the range of forty to fifty-five percent. This result is herein attained by utilizing both the direct current energy from a full-wave rectifier as well as the alternating current energy component thereof. More specifically, in the present invention there is provided a conversion device such as a transistor which is operated with the direct current voltage from a balanced full-wave rectifier as the biasing voltage thereof and driven by the ripple voltage thereof comprising the second harmonic of an input signal. The transistor output then comprises an alternating current signal having twice the frequency of an input signal applied to the full-wave rectifier.

It is an object of the present invention to provide an improved frequency doubling circuit having minimum power requirements and maximum conversion efficiency.

It is another object of the present invention to provide a frequency doubling circuit including a transistor biased by a direct current component of an input signal and driven by the alternating current component of the same signal to produce thereby an output signal having twice the frequency of the alternating current input signal.

It is a further object of the present invention to provide an improved electronic circuit driven solely by an alternating current input signal and producing an output signal having twice the frequency of the input signal with a high conversion efficiency between input and output signals.

Numerous other objects and advantages of the present invention will become apparent to those skilled in the art from the following description and attached drawing illustrating a preferred embodiment of the invention; however, no limitation is intended thereby but instead reference is made to the appended claims for a proper delineation of the true scope of the present invention.

A single preferred embodiment of the present invention is illustrated in the accompanying drawing and, referring thereto, it will be seen that the circuit includes a balanced full-wave rectifier 11. An input transformer 12 comprising part of the rectifier has a primary winding 13 connected between a pair of input terminals 14 and 16 adapted to receive an alternating current input signal therebetween. The transformer 12 is conventionally connected in that a pair of unidirectional conducting devices 17 and 18 is connected in like manner one to each end of the transformer secondary winding 19. The unidirectional devices 17 and 18, preferably crystal diodes, are connected to conduct away from the transformer secondary winding 19 and are in turn connected together on the opposite sides thereof from the transformer winding. Again in conventional manner, the transformer secondary winding 19 is center-tapped and a lead 21 is connected thereto to provide between such lead and the common diode connection a direct current voltage.

As a further portion of the circuit of the present invention there is provided a transistor adapted to be biased by the direct current component of the full-wave rectifier output and to be driven by the ripple voltage or alternating component of same for amplifying the latter. While various transistor circuits are possible to produce this result, it is herein necessary that the transistor have a fairly high current gain, and further that the transistor operates satisfactorily on relatively low direct current biasing voltages as well as having a suitable frequency response. In the illustrated embodiment of the present invention this is accomplished by employing a common collector connection for the transistor. A transistor 22 is thus herein provided with the collector 23 thereof connected to the lead 21 and the base 24 thereof connected through a direct current blocking capacitor 26 to the negative sides of the crystal diodes 17 and 18. A resistor 27 is connected between the base and collector of the transistor 22, and this foregoing portion of the circuit applies alternating current driving power for the transistor as the output of the full-wave rectifier is connected between the base and collector of the transistor with the capacitor 26 allowing only alternating current to flow in the circuit. The output and direct current biasing circuit of the transistor 22 includes the primary winding 28 of an output transformer 29 connected to the emitter 31 of the transistor. The transformer winding 28 is in turn connected to the negative sides of the crystal diodes 17 and 18 through a resistor or choke coil 30 so that the direct current component of the rectifier output is, in effect, connected between the collector and emitter of the transistor. A bypass capacitor 32 is connected across the output of the rectifier between the negative terminals of the crystal diodes 17 and 18 and the lead 21 to thereby bypass alternating current components of the rectifier output and to complete the transistor output circuit. Output current flowing in the emitter-collector circuit through the capacitor 32 and transformer primary 28 induces an output current in the secondary winding 33 of the transformer 29, and this secondary winding is connected between a pair of output terminals 34 and 36 so that a load circuit connected therebetween will have produced therein an alternating current having a frequency of twice the frequency of an input current applied between input terminals 14 and 16.

As regards operation of the present invention, it will be apparent that an alternating current input signal applied between the input terminals 14 and 16 will be operated upon in a conventional manner by the balanced full-wave rectifier 11 producing a direct current output having a second harmonic component of the input signal. In the present invention the input signal may also be of high frequency, as of the order of hundreds of kilocycles. This second harmonic of the input signal is applied between the collector and base of the transistor 22 through the capacitor 26 while direct current energy is applied between the collector and emitter of the transistor 22. It will be seen from the foregoing that the transistor of the circuit converts the direct current voltage of the full-wave rectifier to the second harmonic of the input signal inasmuch as the transistor is in effect driven by the second harmonic voltage created in the rectifier. A substantial gain in the strength of the output signal is afforded by the present invention over prior circuits of this type employing only passive circuitry, for in the present invention the direct current energy is not wasted but is in fact directly utilized. The circuit of the present invention operates to minimize the energy dissipation therein by fully utilizing both the alternating current and direct current components of the rectifier output and thereby provides results far superior to those attainable by prior known devices of this type.

The present invention may also be employed to produce higher multiple frequency signals and yet retain certain advantages of the invention. Thus, by the insertion of a tuned circuit in the output stage of the invention it is possible to provide frequency tripling or quadrupling and still attain a high efficiency by the utilization of the input signal to drive the transistor.

What is claimed is:

1. A frequency-doubling circuit comprising a full-wave rectifier adapted to receive an alternating input signal and to produce a varying direct current signal of twice the frequency of said input signal, a three element transistor, means coupling the direct current component of said direct current signal between first and second elements of said transistor, means coupling the alternating current component of said direct current signal between second and third elements of said transistor, and an output circuit connected between first and second elements of said transistor and receiving an amplified alternating current signal of twice the frequency of said alternating current input signal.

2. A frequency-doubling circuit comprising a full-wave rectifier having input terminals adapted to receive an alternating current input signal and output terminals, a three element transistor, means connecting the emitter and collector of said transistor in parallel with a bypass capacitor across the output terminals of said full-wave rectifier for impressing a direct current bias voltage between said transistor collector and emitter elements, means connecting the base and collector elements of said transistor in series with a blocking capacitor across the input terminals of said full-wave rectifier for driving said transistor with an alternating current component of the rectifier output, and an output element connected in circuit with the transistor emitter whereby current flowing through said element has a frequency of twice the frequency of a signal applied between the input terminals of said full-wave rectifier.

3. A frequency-doubling circuit comprising a full-wave rectifier having input terminals adapted to have impressed therebetween an alternating current input signal and output terminals with a direct current signal varying at twice the frequency of the input signal appearing thereat, a transistor having base and collector and emitter elements, an output transformer having output terminals and a winding connected in series with said transistor-emitter, a bypass capacitor connected between said collector and transformer winding and between the output terminals of said rectifier for applying a bias voltage to said transistor, a resistor connected between said transistor-collector and base, and a blocking capacitor connected in series with said transistor-collector and base across said rectifier output for driving said transistor with a second harmonic of said input signal appearing in the output of said rectifier whereby the current through said transformer winding inducing a signal between the output terminals thereof has twice the frequency of a signal at the rectifier input terminals.

4. A frequency-doubling circuit comprising a three element transistor, output terminals coupled in series with a capacitor between first and second transistor elements, a resistor coupled between said second and third transistor elements, a full-wave rectifier having input terminals adapted to receive an alternating current signal therebetween and output terminals adapted to receive therebetween from said input signal a direct current voltage varying at twice the frequency of said input signal, means connecting said rectifier output terminals across said capacitor for applying a direct current bias voltage to said transistor, and means including a second capacitor connecting said rectifier output terminals across said resistor for applying thereto an alternating current voltage to drive said transistor whereby the signal between said output terminals is double the frequency of an input signal to said rectifier.

5. A frequency-doubler comprising a three element transistor, an input transformer adapted to receive an alternating current input signal across a primary winding thereof and having a center-tapped secondary winding, a pair of diodes connected in like manner one to each end of the transformer secondary winding and directly connected together, a resistor connected between a pair of transistor elements, a capacitor coupling said resistor between the transformer secondary center-tap and the common diode connection for impressing an alternating voltage component upon said transistor, and a capacitor connected between said transformer secondary center-tap and common diode connection and between a third transistor element in one of said pair of elements for biasing said transistor, whereby the current through the latter of said capacitors has twice the frequency of said alternating current input signal.

6. A frequency-doubling circuit comprising a full-wave rectifier including a transformer having a primary winding adapted to receive an alternating current input signal, a pair of diodes connected to opposite ends of a secondary winding of said transformer, and connected together to form a first rectifier terminal, and a connection to a center tap of said transformer secondary winding forming a second rectifier terminal; a transistor including at least an emitter, collector, and base; an output transformer including a primary winding inductively coupled to a secondary winding connected between a pair of output terminals; a capacitor connected in series with the primary winding of said output transformer between the emitter and collector elements of said transistor and across the output terminals of said rectifier for biasing said transistor; a resistor connected between the collector and base elements of said transistor; and a capacitor connected in series with said resistor between said rectifier output terminals for controlling transistor conduction in accordance with an alternating component of rectifier output voltage having twice the frequency of the input signal whereby said transistor conducts through said output transformer at twice the frequency of said input signal.

References Cited in the file of this patent

UNITED STATES PATENTS

| | | |
|---|---|---|
| 2,428,541 | Bagley | Oct. 7, 1947 |
| 2,809,239 | Nielsen | Oct. 8, 1957 |
| 2,813,242 | Crump | Nov. 12, 1957 |